United States Patent [19]

Avery

[11] Patent Number: 4,786,961
[45] Date of Patent: Nov. 22, 1988

[54] BIPOLAR TRANSISTOR WITH TRANSIENT SUPPRESSOR

[75] Inventor: Leslie R. Avery, Flemington Borough, N.J.

[73] Assignee: General Electric Company, Schenectady, N.Y.

[21] Appl. No.: 834,385

[22] Filed: Feb. 28, 1986

[51] Int. Cl.⁴ .................... H01L 27/02; H01L 29/06; H01L 29/72
[52] U.S. Cl. ........................................ 357/43; 357/20; 357/34; 357/35; 357/71; 357/86; 357/88; 307/570; 307/548; 307/544
[58] Field of Search .................... 357/43, 35, 54, 71 R, 357/34, 20, 86, 88; 307/570, 548, 544

[56] References Cited

U.S. PATENT DOCUMENTS

| 3,739,238 | 6/1973 | Hara | 357/43 |
| 3,787,717 | 1/1974 | Fischer et al. | 357/43 |
| 4,117,507 | 9/1978 | Pacor | 357/35 |
| 4,215,322 | 7/1980 | Iwanami | 357/43 |
| 4,396,932 | 8/1983 | Alonas et al. | 357/39 |
| 4,400,711 | 8/1983 | Avery | 357/43 |
| 4,402,003 | 8/1983 | Blanchard | 357/86 |
| 4,611,237 | 9/1986 | Ohuchi et al. | 357/71 R |
| 4,661,833 | 4/1987 | Mizutani | 357/54 |
| 4,692,786 | 9/1987 | Lindenfelser | 357/54 |

FOREIGN PATENT DOCUMENTS

| 60-46064 | 3/1985 | Japan | 357/43 |
| 1396896 | 6/1975 | United Kingdom . | |

Primary Examiner—J. Carroll
Assistant Examiner—Ngan Van Ngo
Attorney, Agent, or Firm—Henry I. Steckler; James C. Davis, Jr.; Paul I. Webb, II

[57] ABSTRACT

An integrated circuit includes a substrate of one conductivity type silicon and an epitaxial layer of the opposite conductivity type silicon on a surface of the substrate. An emitter region of the one conductivity type is in the epitaxial layer and a collector region of the one conductivity type is in the epitaxial layer and extends around but is spaced from the emitter region. A third region of the one conductivity type is in the epitaxial layer and extends partly around and is spaced from the collector region. A highly conductive connector region of the opposite conductivity type extends into the epitaxial layer to a buried region of the opposite conductivity type which is along the junction of the epixtaxial layer and the substrate. The connector region contacts the third region. A thin layer of silicon oxide extends over the epitaxial layer. Separate contacts extend through the epixtaxial layer to the emitter region, collector region and to adjacent portions of the third region and the collector region. A conductive gate is on the insulating layer and across the portion of the epitaxial layer between the collector region and the third region. A second layer of silicon oxide is on the first layer and over the contacts and the gate. A conductive strip is on the second silicon oxide layer and extends through openings in the second silicon oxide layer to contact the emitter region contact and the gate. This provides a bipolar transistor having a MOS transistor having its source and drain connected between the collector and base of the bipolar transistor and its gate connector to the emitter of the bipolar transistor.

9 Claims, 2 Drawing Sheets

BIPOLAR TRANSISTOR WITH TRANSIENT SUPPRESSOR

The present invention relates to a bipolar transistor, particularly a lateral PNP bipolar transistor, which includes means for suppressing transients.

BACKGROUND OF THE INVENTION

There has been developed a circuit for protecting automotive circuits from transient conditions which operates basically like a switch. The circuit is "on" under normal battery conditions (3 v–16 v), but is "off" under all other conditions, such as double normal battery voltage either in forward (correct) or reverse conditions, load dumping of up to at least 60 volts, and positive and negative transients of up to 120 volts with durations of several milliseconds. The circuit includes, as a major element thereof, a PNP lateral transistor to handle the negative transient requirements.

Lateral PNP transistor structures generally used in the power integrated circuit process result in a parasitic P-type MOS (PMOS) transistor between the collector and the base of the PNP transistor which would adversely affect the operations of the circuit. In addition, under normal circuit conditions, the PNP transistor forms an output pass device operating in saturation, which means that the collector-base junction is forward biased. If the emitter is suddenly taken negative by a negative transient, the parasitic PMOS and the PNP transistor would be turned on with the collector acting as an emitter resulting in a reverse flow of current from the output terminal to the input terminal. Therefore, it would be desirable to modify the PNP lateral transistor to eliminate the adverse effect of the parasitic PMOS and to prevent the device from being turned on by a negative transient.

SUMMARY OF THE INVENTION

An integrated circuit including a lateral bipolar transistor formed by a pair of spaced regions of one conductivity type formed in and at a surface of a region of the opposite conductivity type in a body of semiconductor material. A layer of insulating material is over the surface of the body and over the spaced regions. Separate conductive contacts extend through openings in the insulating layer to each of said spaced regions. A second layer of insulating material is over the first insulating layer and over the contacts. A conductive line extends over the second insulating layer and through an opening therein to the contact on one of the spaced regions. A MOS transistor is formed in the region of opposite conductivity type having source and drain regions connected between the other of the spaced regions and the region of opposite conductivity type and a gate connected to one of the spaced regions.

DETAILED DESCRIPTION OF PREFERRED EMBODIMENT

Figure 1:
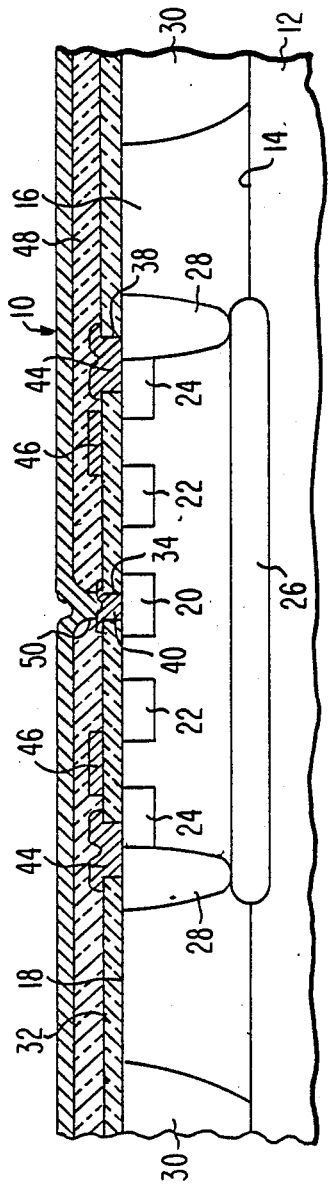
FIG. 1 is a sectional view of a portion of an integrated circuit which includes the lateral bipolar transistor incorporating the present invention.
Figure 2:
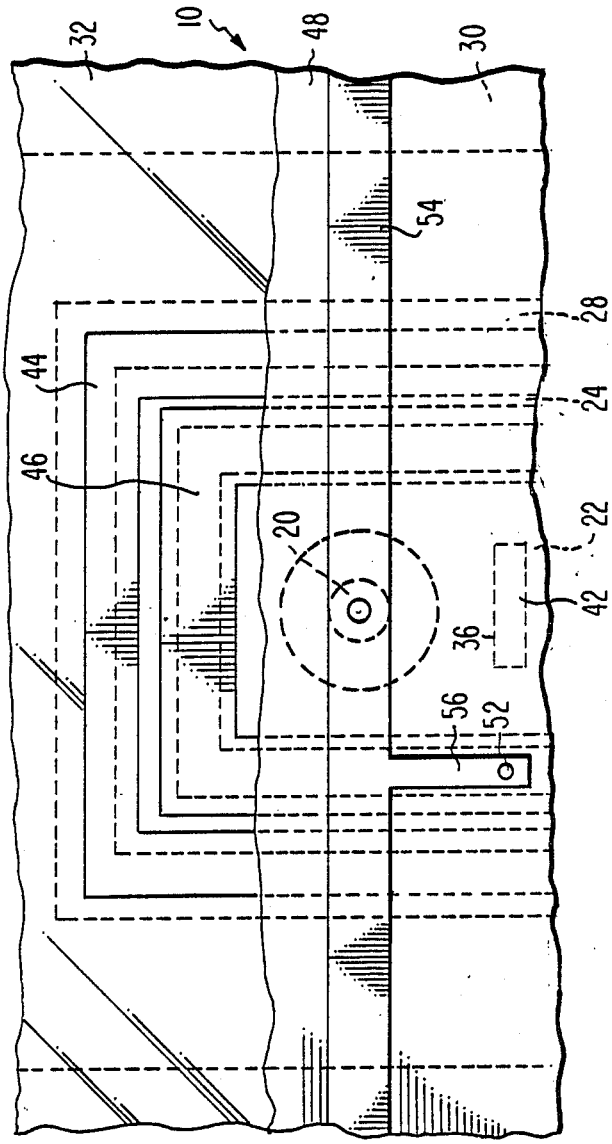
FIG. 2 is a top plane view, partially broken away, of the portion of the integrated circuit shown in FIG. 1.

Referring initially to FIGS. 1 and 2, an integrated circuit which incorporates the present invention is generally designated as 10. Integrated circuit 10 includes a substrate 12 of lightly doped P-type single crystalline silicon having a surface 14. On the surface 14 of the substrate 12 is an epitaxial layer 16 of lightly doped N-type silicon having a surface 18. An emitter region 20 of P-type conductivity is within the epitaxial layer 16 at the surface 18. A collector region 22 of P-type conductivity is in the epitaxial layer 16 at the surface 18. The collector region 22 is spaced from and extends around the emitter region 20. A third region 24 of P-type conductivity is in the epitaxial layer 16 at the surface 18. The third region is spaced from the collector region and extends partially therearound. A buried region 26 of highly conductive N-type conductivity extends across the junction between the substrate 12 and the epitaxial layer 16 and completely across the emitter region 20, collector region 22 and third region 24. A connector region 28 of highly doped N-type conductivity extends through the epitaxial layer 16 from the surface 18 to the buried region 26. The connector region 28 is in contact with the third region 24 and extends therearound. An isolation region 30 of highly conductive P-type conductivity extends through the epitaxial layer 16 from the surface 18 to the substrate 12. The isolation region 30 is spaced from the connector region 28 and extends completely around the emitter 20 to form an isolated region of the epitaxial layer 16 which contains the device of the present invention.

A thin layer 32 of an insulating material, such as silicon oxide, is on the surface 18 of the epitaxial layer 16. The silicon oxide layer 32 has an opening 34 therethrough to the emitter region 20, an opening 36 therethrough to the collector region 22 (see FIG. 2), and an opening 38 therethrough which exposes adjacent portions of the third region 24 and the connector region 28. Contacts 40, 42 and 44 of a conductive material, such as a metal or conductive polycrystalline silicon, extend through the openings 34, 36 and 38 respectively. The contact 40 engages the emitter region 20, the contact 42 engages the collector region 22, and the contact 44 engages both the third region 24 and the connector region 28. A strip 46 of a conductive material is on the silicon oxide layer 32 and extends across the portion of the epitaxial layer 16 between the collector 22 and the third region 24. The conductive strip 46 extends along the entire length of the opposed edges of the collector region 22 and third region 24 to act as a gate of an MOS transistor.

A second layer 48 of an insulating material, such as silicon oxide, is on the first insulating layer 32 and over the contacts 40, 42 and 44 and the gate 46. The second insulating layer 48 has an opening 50 therethrough to the emitter contact 40 and an opening 52 therethrough (see FIG. 2) to the gate 46. A strip 54 of a conductive material, such as a metal, is on the second insulating layer 48 and extends into the opening 50 to contact the emitter contact 40. The conductive strip 54 extends completely across the device to electrically connect the emitter 20 to other devices in the integrated circuit 10. A second conductive strip 56 is on the insulating layer 48 and extends from the emitter strip 54 into the opening 52 to contact the gate 46.

Figure 3:
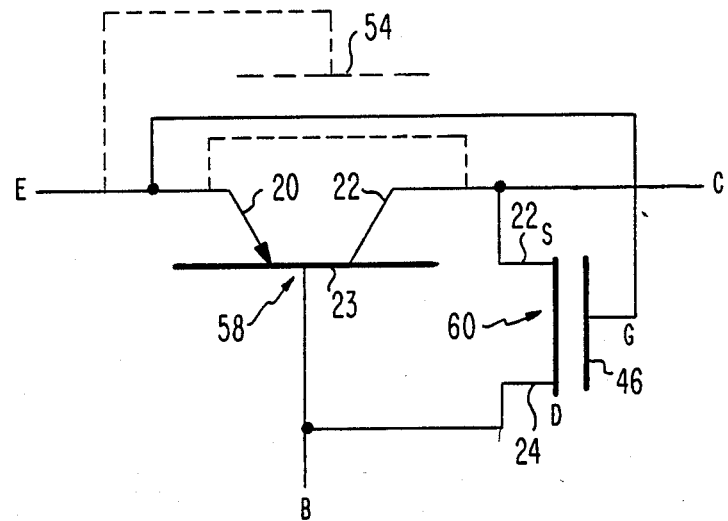
FIG. 3 is a circuit diagram of the lateral bipolar transistor which incorporates the present invention.

As shown in FIG. 3, the integrated circuit 10 forms a PNP bipolar transistor 58 which includes the emitter 20, the collector 22 and a base 23 formed by the portion of the epitaxial layer 16 between and around the emitter 20 and collector 22. The collector region 22 also acts as the source of a P-type MOS transistor 60 in which the third region 24 serves as the drain and the conductive strip 46 as the gate. The drain 24 is connected to the base of the bipolar transistor 58 through the contact 44, and connecting region 28 and the buried region 26. The gate 46 is connected to the emitter 20 of the bipolar transistor 58 by the conductive strips 56 and 54.

The integrated circuit 10 may be made using standard semiconductor processing technology. The buried region 26 may be formed by embedding N-type conductivity modifiers, such as phosphorus, in the surface 14 of the substrate 12 prior to applying the epitaxial layer 16, such as by diffusion or ion implantation. The epitaxial layer 16 is then deposited on the surface 14 using any standard epitaxy process, such as vapor phase epitaxy, and the device is then heated to cause the N-type conductivity modifiers to diffuse from the substrate 12 into the epitaxial layer 16 to form the buried region 26. The P-type regions 20, 22 and 24 may be formed by embedding P-type conductivity modifiers, such as boron, into the surface of the epitaxial layer 16 through openings in a masking layer, such as by diffusion or ion implantation. Likewise, the connecting region 28 and isolation region 30 may be formed by embedding conductivity modifiers of the appropriate conductivity type into the epitaxial layer and heating them to cause them to diffuse through the epitaxial layer.

The silicon oxide layer 32 is preferably formed by heating the epitaxial layer 16 in an oxygen atmosphere to grow the silicon oxide layer 32 thereon. After the openings 34, 36 and 38 are formed in the silicon oxide layer 32 by an appropriate etching step, a layer of a conductive material is applied to the silicon oxide layer 32 and in the openings. Using standard photolithographic techniques and etching, the conductive layer is defined to form the contacts 40, 42 and 44 and the gate strip 46. The second insulating layer 48 is preferably formed by a chemical vapor deposition process. After the openings 50 and 52 are formed in the second insulating layer 48 by an etching step, a layer of conductive material is applied over the second insulating layer 48 and in the openings 50 and 52. The second conductive layer is then defined to form the strips 54 and 56.

In the operation of the bipolar transistor 58 the conductive strip 54 connected to the emitter 20 acts as a gate of a parasitic MOS transistor between the emitter 20 and collector 22 as shown by the dashed lines in FIG. 3. This parasitic MOS transistor can adversely affect the operation of the bipolar transistor 58. However, in the integrated circuit 10 of the present invention the conductive strip 54 is a second level conductor which is spaced from the surface 18 of the epitaxial layer 16 by both the first and second insulating layers 32 and 48. This additional thickness of gate oxide greatly increases the threshold of this parasitic MOS device so as to effectively eliminate the effects of this parasitic MOS transistor.

The PMOS transistor 60 serves to eliminate the effects of negative transients on the bipolar transistor 58. In normal circuit operation, the PMOS transistor 60 is turned off and the bipolar transistor 58 is on and saturated. If there is a negative transient which exceeds the threshold of the PMOS transistor 60, the PMOS transistor 60 is turned on causing a shunt across the collector-base junction. This effectively clamps the voltage at the base 23 of the bipolar transistor 58 to the same voltage as the collector 22 of the bipolar transistor 58, preventing reverse conduction from collector 22 to emitter 20. Thus, the PMOS transistor 60 prevents reverse current flow from the output of the circuit to the input as a result of negative transients.

Although the present invention has been described with regard to a PNP bipolar transistor having a P-type MOS transistor for protection against negative transients, the present invention also applies to a NPN bipolar transistor having an N-type MOS transistor for protection against positive transients. To form the NPN bipolar transistor with an N-type MOS transistor, the polarity of the various regions shown in FIGS. 1 and 2 are reversed.

Thus, there is provided by the present invention an integrated circuit containing a bipolar transistor wherein any adverse effect of a parasitic MOS device is eliminated and which includes a MOS transistor to prevent reverse current flow through the bipolar transistor as a result of negative or positive transients on the emitter. The entire structure is provided in a single isolated region of the integrated circuit so that it does not substantially increase the size of the integrated circuit and can be formed simultaneously with the basic bipolar transistor.

I claim:

1. In an integrated circuit which includes a lateral bipolar transistor formed by first and second spaced regions of one conductivity type formed in and at a surface of a region of the opposite conductivity type in a body of semiconductor material, the improvement comprising, a first layer of insulating material over the said surface of the body and over the first and second spaced regions, said first layer having openings therethrough, separate conductive contacts extending through said openings in said first insulating layer to said first and second regions, a second layer of insulating material over said first insulating layer and said contacts, a conductive strip extending over said second insulating layer and over a portion of the region of opposite conductivity type between said first and second spaced regions, and through an opening in said second insulating layer to the contact on the first region, and a MOS transistor formed in said region of opposite conductivity type having source and drain regions, said source region being connected to the second region, said drain region being connected to the region of opposite conductivity type, and a gate connected to the first region.

2. An integrated circuit in accordance with claim 1 wherein the MOS transistor includes a third region of the one conductivity type in the region of opposite conductivity type adjacent but spaced from the second region and a conductive gate strip on the first insulating layer over the portion of the region of opposite conductivity type between the second region and the third region.

3. An integrated circuit in accordance with claim 2 in which the third region is connected to the region of opposite conductivity type by a highly conductive connecting region of the opposite conductivity type extending into the body and engaging said third region and the gate is connected to the first region by a conductive strip on the second insulating layer which extends through the second insulating layer to contact the conductive contact for the first region and the gate.

4. An integrated circuit in accordance with claim 3 including a conductive contact in electrical contact with both of the third region and the connecting region.

5. An integrated circuit in accordance with claim 4 in which the region of opposite conductivity type is a portion of an epitaxial layer of semiconductor material on the surface of a substrate of semiconductor material of the one conductivity type.

6. An integrated circuit in accordance with claim 5 including a highly conductive buried region of the opposite conductivity type extending across the junction between the substrate and the epitaxial layer and extending across the three regions of the one conductivity type and the connecting region extends from the surface of the epitaxial layer to the buried region.

7. An integrated circuit in accordance with claim 6 in which the second region extends around the first region, and the third region and connecting regions extends partly around the second region.

8. An integrated circuit in accordance with claim 6 in which the one conductivity type is P-type and the opposite conductivity type is N-type to form a PNP bipolar transistor and a P-type MOS transistor.

9. An integrated circuit in accordance with claim 6 in which the one conductivity type is N-type and the opposite conductivity type is P-type to form a NPN bipolar transistor and an N-type MOS transistor.

* * * * *